United States Patent [19]
Clabes et al.

[11] Patent Number: 5,171,992
[45] Date of Patent: Dec. 15, 1992

[54] NANOMETER SCALE PROBE FOR AN ATOMIC FORCE MICROSCOPE, AND METHOD FOR MAKING SAME

[75] Inventors: Joachim G. Clabes, Yorktown Heights; Michael Hatzakis, Chappaqua; Kam L. Lee, Putnam Valley; Bojan Petek, Croton-on-Hudson; John C. Slonczewski, Katonah, all of N.Y.

[73] Assignee: International Business Machines Corporation, New York, N.Y.

[21] Appl. No.: 770,505

[22] Filed: Oct. 3, 1991

Related U.S. Application Data

[63] Continuation-in-part of Ser. No. 608,043, Oct. 31, 1990, abandoned.

[51] Int. Cl.$^5$ ............................................. H01J 37/00
[52] U.S. Cl. .................................. 250/306; 250/423 F
[58] Field of Search ...................... 250/306, 307, 423 F

[56] References Cited

U.S. PATENT DOCUMENTS

| | | | |
|---|---|---|---|
| 4,382,186 | 5/1983 | Denholm et al. | 250/492.2 |
| 4,605,566 | 8/1986 | Matsui et al. | 427/43.1 |
| 4,670,291 | 6/1987 | Mori et al. | 427/35 |
| 4,724,318 | 2/1988 | Binnig | 250/306 |
| 4,939,363 | 7/1990 | Bando et al. | 250/306 |
| 4,943,719 | 7/1990 | Akamine et al. | 250/306 |
| 4,943,720 | 7/1990 | Jones | 250/306 |
| 5,072,116 | 12/1991 | Kawada et al. | 250/306 |

FOREIGN PATENT DOCUMENTS 62-207868  3/1986  Japan.

OTHER PUBLICATIONS

Dowben et al., "Deposition of Thin Metal and Metal Silicide Films from the Decomposition of Organometallic Compounds", Materials Science and Engineering, vol. b(2), 1989, pp. 297-323.

Stauf et al., "Patterned photoassisted organometallic deposition of iron, nickel and palladium on silicon", Thin Solid Films, 156 (1988) L31-L36.

Lee et al., "Direct electron-beam patterning for nanolithography", J. Vac. Sci. Technol. 87(6), Nov./Dec. 1989, pp. 1941-1946.

Albrecht et al., "Microfabrication of cantilever styli for the atomic force microscope", J. Vac. Sci. Technol. A8(4) Jul./Aug. 1990, pp. 3386-3396.

Kuptsis et al., "Production of Carbon and Metallic Films", IBM Technical Disclosure Bulletin, vol. 13, No. 9, Feb., 1971, pp. 2497-2498.

Hans-Werner Fink, "Mono-atomic tips for scanning tunnelling microscopy", IBM J. Res. Develop., vol. 30, No. 5, Sep. 1986.

C. Schneiker et al., "Scanning tunnelling engineering", Journal of Microscopy, vol. 152, Pt. 2, Nov. 1988, pp. 585-596.

D. K. Biegelsen et al., Appl. Phys. Lett. 50 (11) Mar. 1987, "Ion milled tips for scanning tunneling microscopy", pp. 696-698.

Inga Holl Musselman and Phillip E. Russell, "Platinum-/iridium tips with controlled geometry for scanning tunneling microscopy", J. Vac. Sci. Technol. A, vol. 8, No. 4, Jul./Aug. 1990, pp. 3558-3562.

Nyyssonen, D., "Microprobe-Based CD Measurement Tool", IBM Technical Disclosure Bulletin, vol. 32, No. 7, Dec. 1989, p. 168.

Primary Examiner—Bruce C. Anderson
Attorney, Agent, or Firm—Perman & Green

[57] ABSTRACT

Methods are described for producing a needle probe tip having prescribed magnetic properties for a scanning magnetic force microscope (MFM) on a substrate positioned in an evacuated environment. A substantially rigid, nanometer-scale needle-like structure is produced by selective decomposition of a volatile organic compound by a highly focussed electron beam. Processing steps are described to obtain prescribed magnetic properties of such a needle probe structure; in particular, the fabrication of a single magnetic domain, with hard or soft magnetic properties at the distal end of the needle structure. Three dimensional probe tips are also achieved. These magnetic sensing probes allow magnetic imaging at the nanometer-scale level.

27 Claims, 6 Drawing Sheets

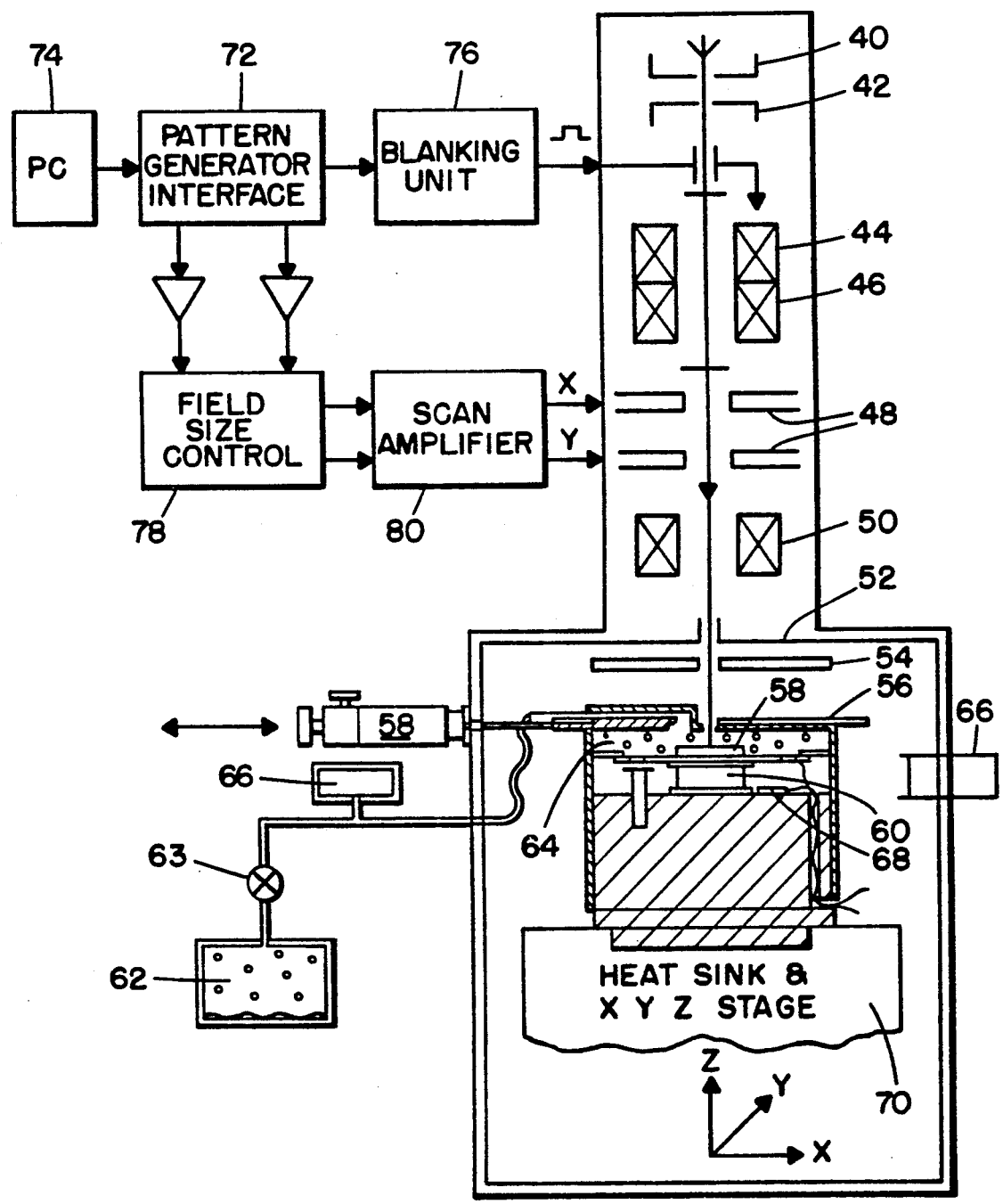

NANOMETER SCALE PROBE FOR AN ATOMIC FORCE MICROSCOPE, AND METHOD FOR MAKING SAME

This application is a continuation-in-part of earlier filed application Ser. No. 07/608,043, filed Oct. 31, 1990, abandoned.

FIELD OF THE INVENTION

This invention relates to atomic force microscopy, and more particularly, to a nanometer scale probe for use with an atomic force microscope.

BACKGROUND OF THE INVENTION

Scanned probe microscopy saw its commencement at the atomic level with the invention by Binnig et al. of the scanning tunnelling microscope in the mid-1980's. In the scanning tunnelling microscope (STM), a tiny tungsten probe is maneuvered to within a nanometer above the surface of a conducting specimen, sufficiently close so that there is an overlap between the electron clouds of the atom at the probe tip and of the nearest atom of the specimen. When a small voltage is applied to the tip, electrons "tunnel" across the gap generating a small tunnelling current. The strength of that current is very sensitive to the width of the gap. Piezoelectric controls are used to control the motion of the probe and move it back and forth across the specimen while maintaining a constant gap between its tip and the specimen surface. The variations in voltage applied to maintain the probe properly positioned over the surface are electronically translated into an image of the surface topography.

The invention of STM has led to the development of a family of new scanned-probe microscopes, one of which is the atomic force microscope (AFM) which negates the need for a conducting specimen. In its first implementation, the AFM relied upon the repulsive forces generated by the overlap of the electron cloud at the tip's surface with electron clouds of surface atoms within the specimen. The tip was mounted on a flexible beam which maintained the tip pressed against the specimen surface with constant force as it was moved across the surface.

While a number of methods have been used to measure the movement of the AFM beam/tip, more recently, this has been done by a laser beam. The reflected laser beam is detected and enables beam movements to be converted to imaging signals.

A more recent development is an AFM that is based on the detection of an attractive force between a surface and a probe by its effect on the dynamics of a vibrating probe/beam arrangement. Commonly in such arrangements, a tapered tungsten wire is driven by a piezoelectric transducer mounted at its base to vibrate at close to the wire's resonant frequency. As the tip of the wire is moved across a surface, vibration amplitude changes occur as a result of the attractive forces. The changes in the vibration amplitude are sensed by an interferometric laser arrangement.

A block diagram of an AFM using interferometric laser detection is shown in FIG. 1, with a probe arrangement 10 being emplaced over the surface of specimen 12. Changes in oscillation amplitude of probe arrangement 10 are sensed by a laser heterodyne interferometer 14 that provides an output signal to a feedback generator 16. As an output signal changes with respect to an applied reference signal, feedback generator 16 provides position control signals to a piezoelectric position control unit 18. Those control signals cause a piezoelectric unit within position control element 18 to move the specimen so that the vibration amplitude is stabilized and, hence the force gradient. The fluctuations in the feedback potential are converted into a profile of the surface being investigated.

Another variation of the AFM with which the invention can be used is the electrostatic-force microscope where the vibrating probe bears an electric charge and its vibration amplitude is affected b elecrostatic forces resulting from charges in the sample. One form of AFM is a magnetic-force microscope (MFM). In an MFM, a magnetized nickel or iron probe is substituted for the tungsten or silicon needles used with other AFM's. When the vibrating probe is brought near a magnetic sample, the tip feels a magnetic force that changes its resonance frequency and hence its vibration amplitude. The MFM traces magnetic-field patterns emanating from the specimen.

The magnetic force components sensed by an MFM probe result from the interaction of the total magnetic dipole moments at the tip of the probe and the specimen. They are further dependent upon the influence of tip-related magnetic fields on the local magnetic moments of the specimen. The lateral resolution of the probe depends critically on the interaction volume constituted by the sample and the tip. For planar magnetic media, this interaction volume is determined primarily by geometric and magnetic properties of the probe tip. Thus, in order to obtain lateral resolutions below 1000 Angstroms, current tip sizes in the range of 1000 Angstroms are too large.

Recent theoretical calculations by Wadas in the Journal of Magnetism and Magnetic Materials, Vol. 71, p. 147 (1988) and Vol. 72, p 292 (1988) show that even for probe tip sizes below 1000 Angstroms, detection sensitivity of the magnetic forces can be greatly improved by optimization of probe tip shape. Those calculations suggest that only the first 100 Angstroms of magnetic material at the tip are effective in contributing to magnetic force interactions that yield high resolution information. The remainder of the magnetic material at the probe tip contributes a background force due to long-range interactions between the magnetic cantilever and the specimen. These interactions are detrimental to sensitivity and spatial resolution and may induce domain wall motion in soft magnetic materials and instability in the tip-to-specimen separation.

Currently, magnetic sensor probe tips are fabricated by an electrochemical etching technique using a ferromagnetic wire material (such as nickel, iron, or cobalt). Essentially the method comprises etching the tip of the wire until it approximates a point. This method does not provide control over the geometric shape of the tip below a 1000 Angstrom radius. Such probe tips, further, have an unnecessarily large amount of magnetic material with a complicated domain structure. In essence, subtractive processes for creating MFM and other AFM probe tips, do not today, provide the desired atomic-level resolution capability.

The prior art is replete with many additive techniques for deposition of both magnetic and nonmagnetic materials. High energy electron and laser beams are also used to enhance local deposition of materials onto a surface from a gaseous environment. Those systems generally are employed to deposit a pattern onto a substrate, such pattern derived by selective deposition of one or more components of the gaseous environment through which the energy beam is being directed. In U.S. Pat. No. 4,382,186 to Denholm et al., a process is described which employs finely focussed electron beams to effect physical, chemical and other changes on the surface of a substrate. In U.S. Pat. No. 4,670,291 to Mori et al. The injection of exotic atoms into a semiconductor substrate is achieved through the use of an electron beam irradiation scheme.

Additive techniques have been used in the prior art to create ultra-fine ASM crystalline probe tips. In U.S. patent application, Ser. No. 07/568,286 to Bartha et al, entitled "Method of Producing Micromechanical Sensors For the AFM/STM Profilometry and Micromechanical AFM/STM Sensor Head", an additive method is described for the fabrication of a cantilever beam and crystalline tip. In U.S. patent application, Ser. No. 07/568,451 to Bayer et al, entitled "Method of Producing Ultra Fine Silicon Tips For the AFM/STM Profilometry", silicon is employed as the tip material. Once the silicon tip structure is formed by masking, the tip shaft is thinned through an etch procedure. Tip structures having horizontal protrusions are also disclosed. In U.S. patent application Ser. No. 07/568,306 to Bayer et al, and entitled "Method of Producing Micromechanical Sensors for the AFM/STM Profilometry and Micromechanical AFM/STM Sensor Head", there is disclosed a method for constructing low-mass microcantilever beams with integrated silicon-based tips. It is also disclosed that such tips may carry a metallic coating.

In U.S. patent application, Ser. No. 07/619,378 to Nyyssonen, entitled "Micro Probe-Based CD Measurement Tool", a silicon-based micro probe tip is shown which includes lateral protuberances to enable the probe to detect sidewalls of trenches in which it is emplaced. Each of the above-noted patent applications is assigned to the same assignee as in this application. A further reference, authored by Nyyssonen which speaks to multi-point probe tips can be found in a brief article entitled "Micro Probe-Based CD Measurement Tool", IBM TDB, Vol. 32, No. 7, December 1989, page 168.

Other references showing various-shaped tips comprised of crystalline material can be found in the following prior art publications: "Ion Milled Tips For Scanning/Tunnelling Microscopy", Biegelsen et al., Applied Physics Letters, Vol. 50, No. 11, 16 March, 1987, pp. 696–698; "Platium/Iridium Tips With Controlled Geometry For Scanning/Tunnelling Microscopy", Musselman et al., Journal of Vacuum Science Technolgy A, Vol. 8, No. 4, July/August 1990, pp. 3558–3562; "Scanning/Tunnelling Engineering", Schneiker et al., Journal of Microscopy, Vol. 152, Part II, November, 1988, pp. 585–596; and "Mono-Atomic Tips for Scanning/Tunnelling Microscopy", Fink, IBM Journal of Research and Development, Vol. 30, No. 5, September 1986, pp. 460–465.

In U.S. Pat. No. 4,605,566 to Matsui et al., a film is deposited on a semiconductor substrate by passing a gas containing an element over the substrate and then irradiating a determined portion thereof with an electron beam. The gas decomposes and the element is precipitated onto the substrate so as to form a desired pattern. Chromium, molybdenum, aluminum, and tungsten containing organometallics are disclosed. In Japanese Patent 87-295,868/42 the use of organometallic compounds is described for producing a film of group VIII metals on a substrate. Electron beams have also been used to enable surface analysis of substrates (e.g., see Kuptsis, IBM Technical Disclosure Bulletin, Vol. 13. No. 9. February, 1971. pp. 2497-2498). More recently, it has been found that iron, nickel, and palladium may be deposited on silicon directly from metallocenes. This is in contrast to other energy-beam assisted deposition systems wherein metal carbonyls and metal alkyls are employed as organometallic source compounds. Such actions are described by Stauf et al. in "Patterned Photo Assisted Organometallic Deposition of Iron, Nickel and Palladium on Silicon", Thin Solid Films, 156 (1988) pp. L31–L3. In specific, Stauf et al. indicate that depositions of metals from the decomposition of cobaltocene, nickelocene, and ferrocene were achieved by both conventional pyrolysis and by single-photon (non-thermal) decomposition or plasma-assisted deposition. Photon assisted deposition, as well as electron beam deposition, are essentially non-thermal in character.

Accordingly, it is an object of this invention to produce an AFM probe tip through the use of an additive process.

It is another object of this invention to produce a high aspect ratio probe tip of precise nanometer-scale dimensional characteristics.

It is yet another object of this invention to provide an electron beam and plating deposition method for producing probe tips.

SUMMARY OF THE INVENTION

A probe tip for a scanned probe microscope is configured as a needle extending from a surface, the needle further comprising a carbonized matrix of a decomposed organic reactant. The needle exhibits a substantial stiffness along its elongated dimension and has a nanometer scale tip dimension. A method is described for producing such a needle probe tip wherein a substrate is positioned in an evacuated environment; a volatile organic compound is introduced into the environment and an energy beam, for example a laser beam, an electron beam and an x-ray beam from a synchrotron and the like, is directed at the substrate's surface, which energy beam is maintained stably focussed thereon for a preset time period. The beam causes a selective decomposition of the organic compound at the focal point on the substrate surface and causes succeeding layers of decomposition product of the organic compound to grow directly up the beam, to thus produce a substantially rigid nanometer-scale needle-like form. A magnetic layer may then be deposited on the top of the structure, such layer having a dimension which restricts the tip to exhibit a single magnetic domain. Three dimensional structures are also disclosed.

DESCRIPTION OF THE DRAWINGS

FIG. 5 is a schematic view of a modified scanning electron microscope used to implement the method of this invention.

DETAILED DESCRIPTION OF THE INVENTION

Figure 1:
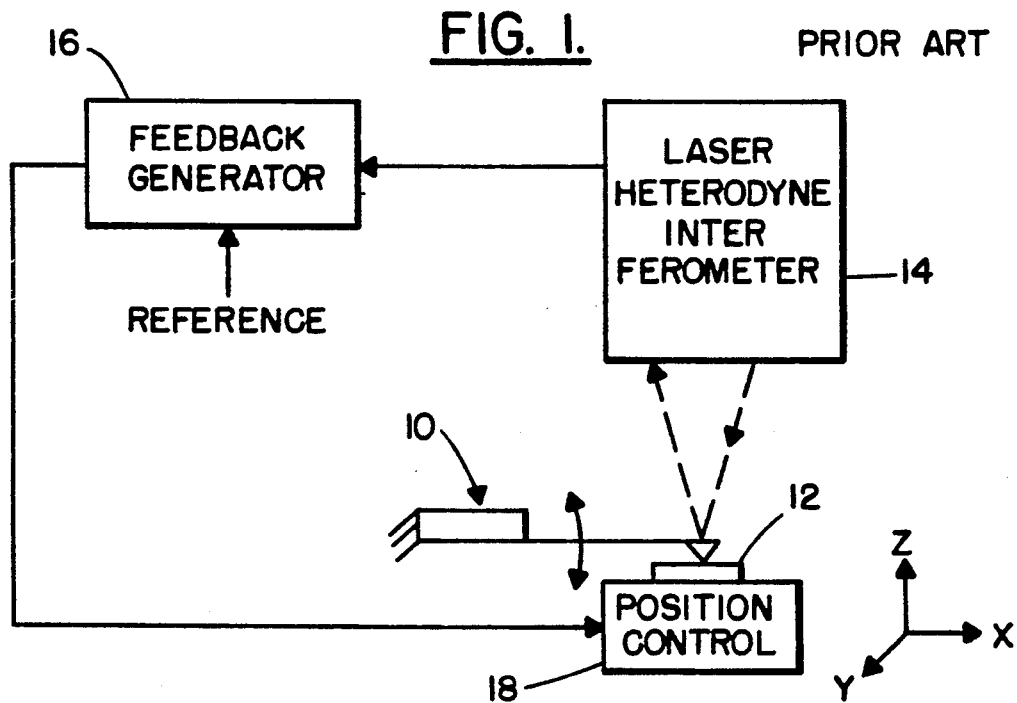
FIG. 1 is a block diagram showing a scanned-probe microscope of the prior art.
Figure 2:
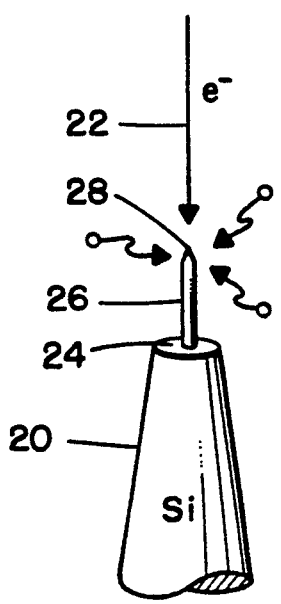
FIG. 2 is a schematic, perspective view of a silicon probe on which a nanometer-scale needle probe is grown in accordance with the invention.

Referring now to FIG. 2, the structure of an AFM nanometer-scale needle probe will be described, including the process for producing such a probe. Initially, a substrate 20 is placed in an evacuated chamber within an electron beam unit. In this example, substrate 20 is a silicon cone. A volatile, organometallic compound gas stream is then introduced into the subchamber 64, while at the same time, an electron beam 22 is turned on. Beam 22 impinges upon an upper surface 24 of substrate 20 and causes decomposition and preferential deposition of the decomposed products of the organometallic gas onto surface 24. Such deposition occurs within the region irradiated by electron beam 22 and also out therefrom by a radial distance determined by electron scatter from surface 24. If it is assumed that electron beam 22 has a diameter of 6 nanometers (60 Angstroms), the diameter of the initial deposit is approximately 100 nanometers. As the process continues, additional layers of deposited, decomposed components of the organometallic gas continue to build up, thereby creating a needle-like shape 26.

Figure 3:
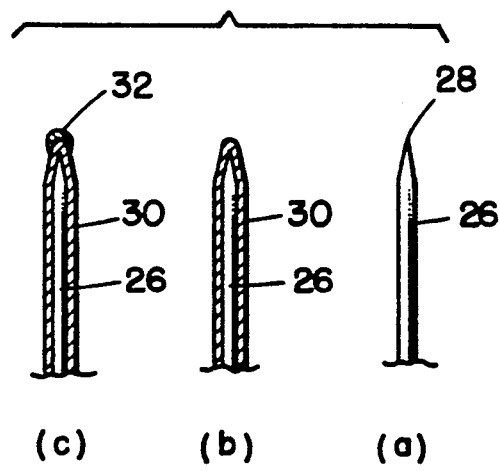
FIGS. 3(a)–(c) show three separate versions of the nanometer-scale needle of this invention.

A conical tip shape for needle 26 and its shank diameter are achieved by control of the primary beam voltage and also the beam's gaussian profile. In general, the needle diameter and the respective cone apex angle decrease with increasing beam voltage (10% for a 10 kV increase). Such a needle shape is shown in FIG. 3(a). It has also been found, with appropriate controls, that the apparent diameter of pointed end 28 of needle 26 can be made approximately 10 nanometers. When needle 26 is constructed to exhibit magnetic characteristics, a 10 nanometer tip diameter will restrict the magnetic action thereat to a single domain, thereby avoiding the aforestated problems which arise from long range magnetic field line intercouplings.

The process employed to deposit needle probe 26 onto a substrate is an electron beam chemical vapor deposition (CVD) process. Such processes, per se, are known in the prior art, e.g., see Japanese Patent 87-295,868/42. Nevertheless, to Applicants' knowledge, such processes have not heretofore been employed to produce nanometer scale, needle-like structures having a high aspect ratio. It has further been found that the E-beam CVD process produces a needle probe which exhibits substantial stiffness along its elongated dimension. It is believed that this rigidity results from the CVD process producing a needle with a carbon matrix structure in which metal particles are dispersed. In other words, the included carbon toughens the structure and makes it usable as an AFM probe. Without such structural stiffness, needle probe 26 would be useless as an AFM probe.

While metal carbonyls or metal alkyls can be employed as organometallic source compounds for the CVD process, it is preferred that metallocenes be employed due to the non-thermal, decomposition process occurring under E-beam irradiation. To produce a needle probe having intrinsic magnetic characteristics, cobaltocene, nickelocene, and/or ferrocene are preferred. In such case, a needle structure such as shown in FIG. 3(a) is grown and exhibits intrinsic, but weak, magnetic capabilities. Such needle structure comprises a carbon matrix with nickel, cobalt or iron particles, as the case may be, dispersed therein.

For applications requiring a more strongly magnetic tip on the needle probe, different growth conditions should be employed involving at least two processing steps: a seeding step followed by a plate-up of a magnetic material. Among various alternative methods, two are preferred. In the first method a seeding material (e.g., allycyclopentadienylpalladium) is used to grow needle 26 (see FIG. 3(b)). This results in a non-magnetic needle structure having palladium seed particles interspersed. The entire surface of needle 26 is then covered, in a subsequent electroless plating process, by a magnetic metal layer 30.

In the second method (see FIG. 3(c)) the needle 26 is grown without an included metal component. Then a seeding material 32 is deposited only on the apex of needle 26. This is accomplished by introduction of a gaseous metallorganic containing the seed metal, followed by electron beam exposure of the tip area. A subsequent plating (e.g. selective CVD in a gaseous or liquid environment) of a magnetic metal 30 will therefore be confined to the seeded area at the apex and will yield a single domain magnetic sensor region for needle probe 26.

Figure 4:
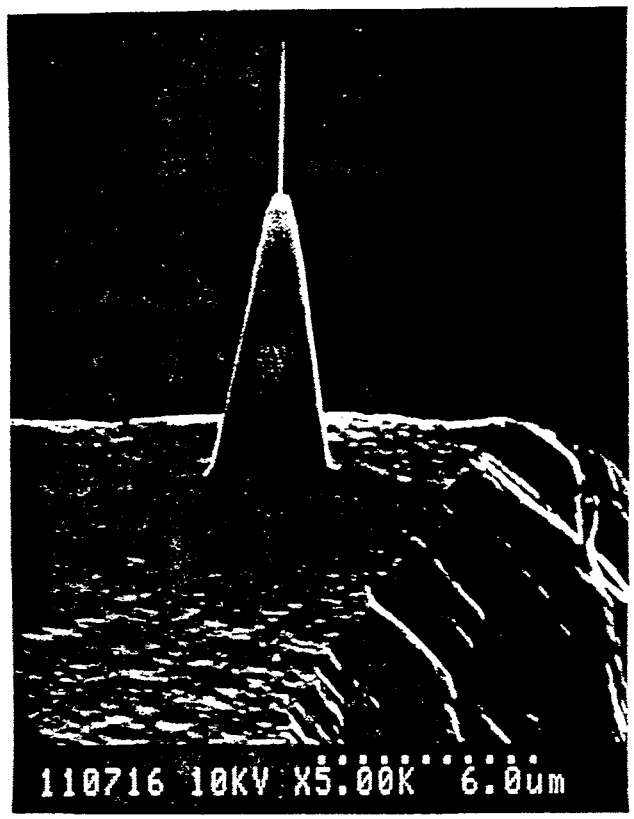
FIG. 4 is a photomicrograph showing a nanometer-scale needle produced on a silicon probe tip in accordance with this invention.

In FIG. 4, a perspective view taken from an SEM photograph is shown wherein a 3 micron long needle probe with a 100 nanometer shank diameter was produced using the method of this invention. The substrate is a silicon pedestal produced via selective etching.

Silicon probe tips such as tip 20 shown in FIG. 2 or the one shown in FIG. 4, are produced by microfabrication techniques that are known in the art. For instance, see Albrecht et al., "Microfabrication of Cantilever Styli for the Atomic Force Microscope", Journal of Vacuum Science Technology, A8(4), July/August, 1990, pp. 3386-3396. In that reference and in the references cited therein, techniques are described for selective etching of silicon substrates to enable the creation of an AFM cantilever with an integral pointed silicon probe tip. The procedures used to provide such integral cantilever/probe structures employ selective etching and mask undercutting to enable production of the probe tips. The Albrecht et al. article also describes methods for fabricating thin film $SiO_2$ and $Si_3N_4$ microcantilevers having integral probe tips. Such procedures do not form a part of this invention, although they do provide the methods and procedures whereby an appropriate support surface for the needle probe of this invention can be produced.

Turning now to FIG. 5, a direct E-beam deposition system is shown and comprises a modified scanning electron microscope. The column portion of the microscope includes a filament 40 which is preferably a lanthanum boride electron source. A movable anode structure 42 is provided to enable the beam brightness to be optimized. The beam passes through a pair of condenser lenses 44, 46, double deflection coils 48 and a final lens 50. From there, the beam enters a lower chamber 52, passes through a backscatter electron detector 54 and then passes into and through a retractable shutter arrangement 56. A linear drive mechanism 58 controls the position of the retractable shutter.

During the period when deposition is occurring, the shutter is closed and the beam passes through a pinhole therein (not shown). When the shutter is open, high resolution secondary electron and scanning transmission imaging can be carried out for probe size monitoring and residual astigmatism correction.

Substrate 58 is positioned in subchamber 64 and on a Peltier effect heater/cooler 60 which maintains constant its temperature. A vapor source 62 provides a vapor of an organometallic containing gas into subchamber 64. A capacitance nanometer 66 maintains the pressure within subchamber 64 within desired limits. Various detection systems are included, including a secondary electron detector 66 and a STEM detector 68. The position of substrate 58 is controlled by an XYZ stage 70 and controls that enable the discrete positioning of stage 70 (not shown).

The deposition system is interfaced to a pattern generating unit 72 which is controlled by a personal computer 74 to vector position the electron beam onto the substrate. Electron beam on-time is controlled by an electrostatic blanking unit 76. The exposure time per pixel ranges from 1 microsecond to greater than 100 seconds. For a 50×50 micron field, a beam step size of approximately 5 nanometers can be obtained with 14 bit digital to analog conversion. Such control is exerted by field size control unit 78 through scan control amplifiers 80.

For direct E-beam deposition, a source gas is introduced from vapor source 62 through a metering needle valve 63 into subchamber 64 within lower chamber 52. Subchamber 64 is differentially pumped to an operating pressure range of 10-100 m Torr. Such pressures are compatible with the available beam current densities, and enable optimum growth in the E-beams CVD process. Typical pressure in SEM chamber 52 is approximately $10^{-4}$ Torr and the pressure in the gun area which encompasses source 40 is approximately $10^{-7}$ Torr.

As the E-beam CVD process is considerably less sensitive than other resist-based processes, relatively long exposure times are required. Such times demand high stability from the electron-optical column and the substrate stage. For the above-noted SEM column, no noticeable beam drift was observed and the measured beam current variation over an exposure time of two hours was approximately 5%. The major source of drift was found to occur in the microscope stage where sample cooling caused thermal stresses in the stage assembly. The problem was corrected by providing sufficient heat sinking to subchamber 52. In this manner, sample temperature variation was kept within 1° C., without noticeable drift in substrate position.

As semiconductor device structures have shrunk from a few microns to the submicron level, problems incident to the performance of device feature metrology (measurement) have substantially increased. Typically, for devices with 0.5 micron features or below, acceptable errors in critical measurements are in the ±10 to 50 nanometer range. In addition, the use of recessed structures (e.g. trench capacitors) has increased the need for instrumentalities to measure such features.

Figure 6:
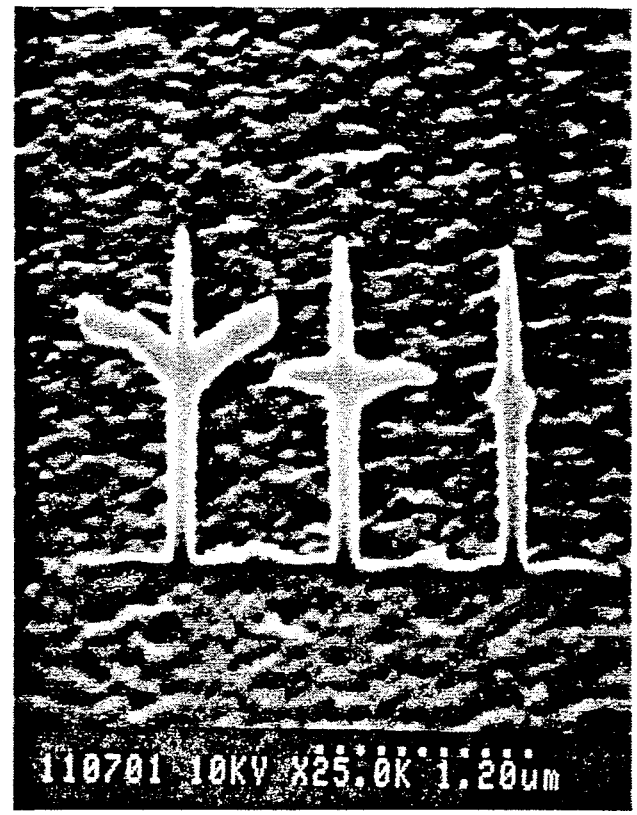
FIGS. 6-8 are photomicrographs showing nanometer-scale needle structures having three-dimensional tip arrangements.
Figure 7:
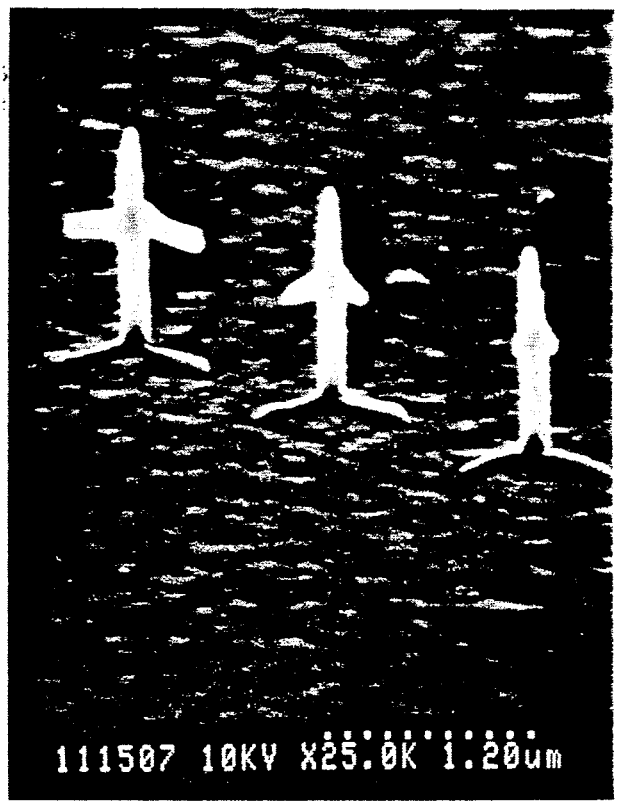
Figure 8:
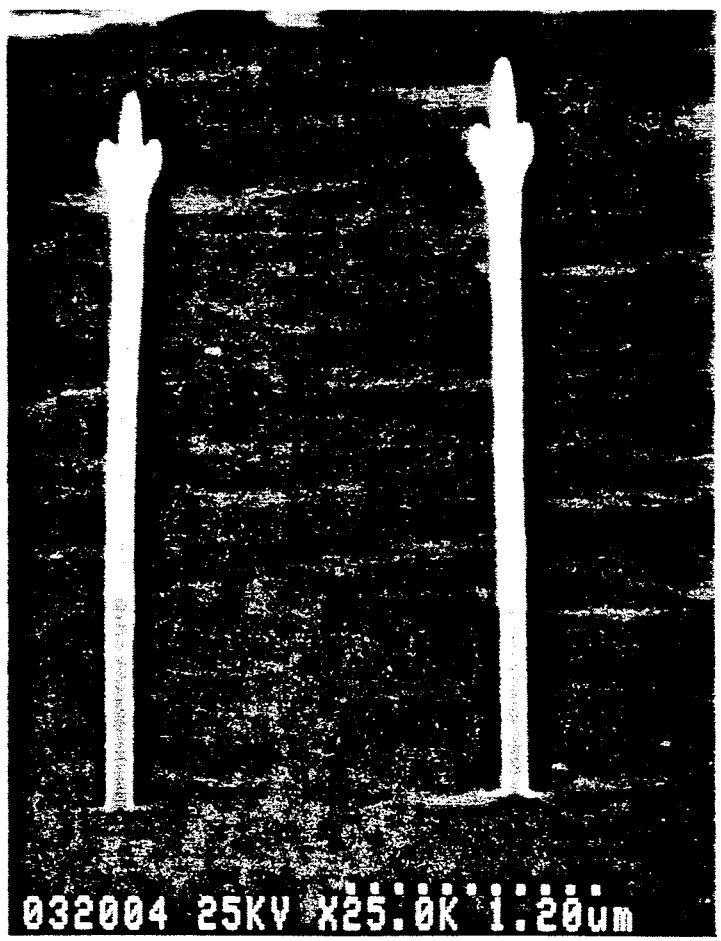

In FIGS. 6-8, three-dimensional tip structures are shown, which when used in combination with an Atomic Force Microscope, provide an ultra-high resolution metrology tool. The apparatus employed to produce such three-dimensional nanometer-scale tip structures is that shown in FIG. 5.

In specific, organometallic gas molecules are introduced into the vacuum above the sample surface where they form a very thin surface adlayer upon adsorption. An electron beam radiates the sample surface (e.g. a silicon needle, as aforedescribed). The exposure to the electron beam causes a decomposition of the adlayer and enables continued adsorption of additional organometallic gas molecules. The focused electron beam is programmed to stay stationary for a finite time until a shank structure of a given height is formed. At that point, the beam is programmed by pattern generator 74 (see FIG. 5) to step sideways from the center of the tip shank to begin the growth of a sideward facing tip.

The geometry of the sideward-facing tip is determined by the beam's energy, beam size, separation between successive horizontal steps, the duration of beam at each horizontal step and the total number of horizontal steps employed. When the desired length of a sideward-facing tip is reached, the beam is returned to the center of the tip shank and begins to step in the opposite direction to grow an oppositely-facing sideward-directed tip. When the growth of that tip is completed, the beam is programmed to move back to the center of the shank, where it remains stationary for a given period to grow a vertically facing tip or until additional sideward facing tips are called for.

FIG. 6 shows a microphotograph of various three-dimensional tips formed using the technique described above. FIG. 7 shows examples of three-dimensional tips where the side-tips were grown perpendicular to the shank. FIG. 8 shows an example of a high aspect ratio, three-dimensional tip which is designed for deep silicon-trench dimensional metrology. The tip shank diameter is approximately 0.1 microns and the shank length is approximately 3 microns, giving an aspect ratio of approximately 30. Each side tip is approximately 0.1 microns in diameter and 90 nanometers in length. The upward facing tips have lengths which vary form 0.1 microns to 0.35 microns.

As semiconductor devices are typically fabricated with multi-layers of different materials (e.g. oxides, nitrides, metals, polyimides, etc.), and it is not uncommon that trench walls and bottoms of trenches are made of different materials, it is useful to optimize the interaction force between a nanometer scale tip and the trench wall surfaces In order to do so, the side tips of the structures shown in FIGS. 6-8 can be fabricated using different materials. This is achieved during the E beam, chemical vapor deposition process by introducing an appropriate organometallic material gas for different stages of the side-tip fabrication. As a result, the metallic material is deposited only in the tip region which is exposed to the E beam and during the time the organometallic gas is present. In the alternative, the side tip can be used as a seeding layer for subsequent selective plating of desired materials, using either a gaseous CVD process or an electroless plating process. The aforesaid process is equally applicable to the fabrication of the tip shank where appropriate materials can be chosen to give the required rigidity for the high aspect ratio shank structure.

Figure 11:
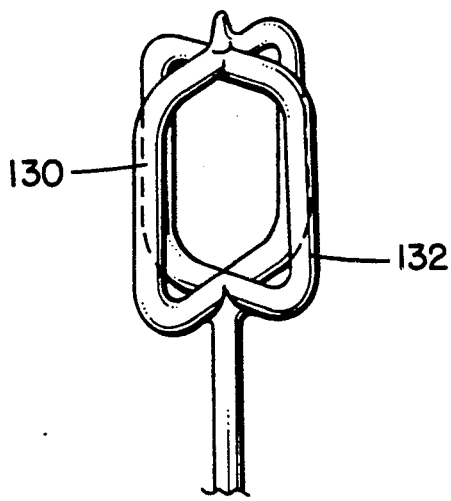
FIG. 11 is a perspective view of a shank with orthogonally oriented loops.
Figure 12:
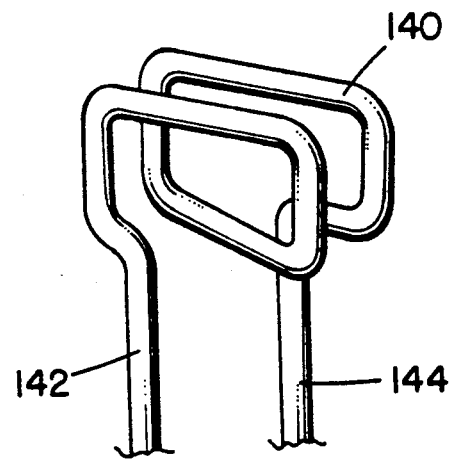
FIG. 12 is a perspective view of a helix connecting two nanometer-scale shanks.
Figure 13:
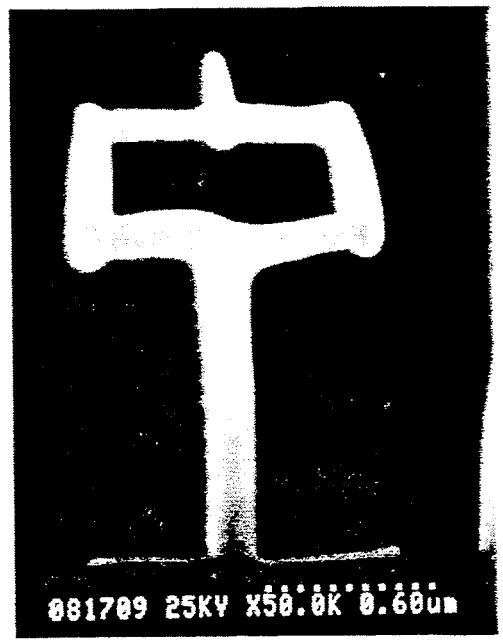
FIGS. 13-15 are photomicrographs of structures corresponding to those illustrated in FIGS. 9-11.
Figure 14:
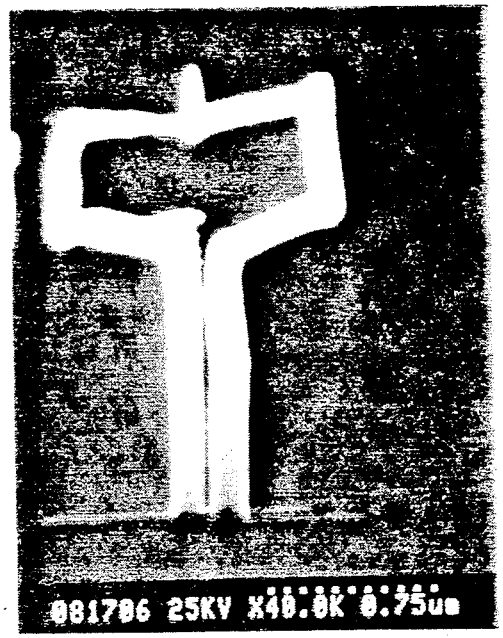
Figure 15:
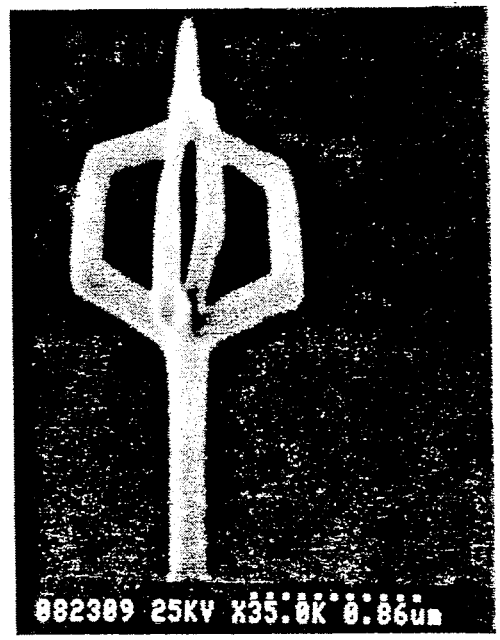

The system and procedures described above may be used to produce loop structures exhibiting nanometer dimensions. In FIGS. 9-12 illustrations of various loop structures are shown. FIGS. 13-15 are photomicrographs of the loop structures illustrated in FIGS. 9-11.

Figure 9:
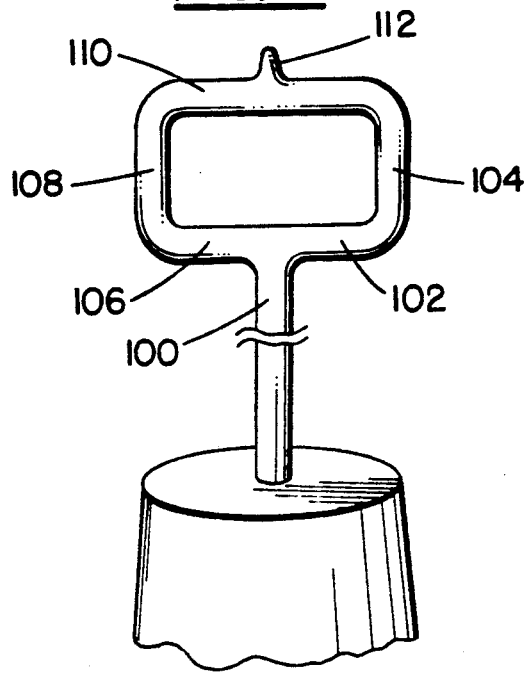
FIG. 9 is a perspective view of a nanometer-scale shank on which a closed loop has been produced.

Referring first to FIG. 9, the loop structure there shown may be produced using the system of FIG. 5. The focussed electron beam is first programmed to remain stationary to grow loop shank structure 100. When the required height of loop shank 100 is reached, the beam is stepped horizontally to grow side structure 102. Beam displacement per step is 6 nm and the beam exposure time per step is 0.6 second. When the end of side structure 102 is reached, the beam is programmed to remain stationary at the end of side structure 102 for a given time to grow vertical structure 104. When the growth of vertical structure 104 is completed, the beam is moved back to the top of shank structure 100 and is stepped in the negative x direction to grow side structure 106 with similar growth conditions as for side structure 102. When the growth of side structure 106 is complete, the beam is again programmed to remain stationary to grow vertical structure 108. When the growth of vertical structure 108 is complete, the beam is stepped horizontally from the top of vertical structure 108 and moved in the positive x-direction to grow horizontal structure 110. The beam displacement per step and the exposure time per step are similar to those used to grow side structures 102 and 106. The number of horizontal steps to grow horizontal structure 110 are twice that for structures 102 and 106, such that the end of structure 110 will meet the top of vertical structure 104 to complete the formation of the loop. When the growth of horizontal structure 110 is complete, the beam is moved to the center of structure 110 where it is programmed to remain stationary for a finite time to grow the end tip 112.

Figure 10:
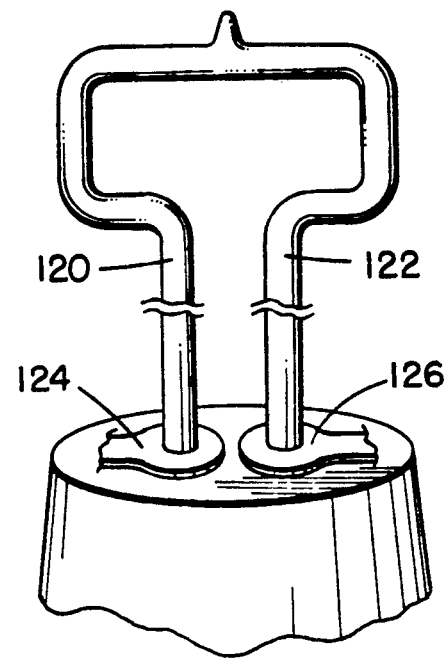
FIG. 10 is a perspective view of a loop connecting two nanometer-scale shanks.

In FIG. 10, a similar loop structure is shown, except that the loop is supported by two independent shanks 120 and 122 which have been grown on conductive lands 124 and 126, respectively. Electrical interconnections (not shown) to conductive lands 122 and 126 enable currents induced in the nanoloop to be sensed or enable a current to be introduced into the loop. In FIG. 11, a multidimensional nanoloop structure is shown including a first loop 130 and an orthogonally oriented loop 132. In FIG. 12, a helical loop structure 140 is shown connected between shanks 142 and 144. The procedures for producing the structures of FIGS. 10-12 are essentially the same as that described for FIG. 9.

FIGS. 13, 14 and 15 are photomicrographs of nanoloop structures, similar to those illustrated in FIGS. 9-11, which have been fabricated using the systems and procedures described above.

Such three-dimensional tip structures have a number of uses. They may be used as nanoloop surface flux sensors. Thus the closed loop can be utilized to map flux distribution as a function of surface separation. The tip can be run in the atomic force mode such that the closed loop is at a programmed distance from the sample surface. By employing the xy fine motion of a piezoelectric stage, a three-dimensional map of the flux distribution above a surface can be obtained.

A nano-scale antenna can be configured for transmitting or receiving a specified radiation from one region to another. Further, such an antenna may help to monitor local static or dynamic phenomena in the sample (e.g. when a small region of a sample is excited by a focussed beam). Such structures also can see use as nano-scale manipulators for molecules, as micro-magnetic heads for submicron recording, or for use in nanoscale devices which employ tunnel current modulation.

EXAMPLE 1

Using the E-beam system shown in FIG. 5, a weak magnetic probe needle comprised of nickel embedded in a carbon matrix, having a shank diameter of approximately 100 nanometers and length of two microns was deposited on a silicon substrate. The organometallic gas used for this example was a nickelocene complex at a vapor pressure of 5 mTorr in subchamber 64. The substrate temperature was 20° C., the beam voltage was 30 kV and the beam size diameter was approximately 6 nanometers. The exposure time was between 5 and 10 minutes.

EXAMPLE 2

A strong magnetic needle sensor was produced under the following experimental conditions: A needle was first grown under same beam conditions and temperature as described above, using allycyclopentadienylpalladium complex as the vapor source material. Subsequently, the needle surface was plated in an electroless $NiSO_4$ solution at 65° C. yielding ~10 nm nickel coverage in 5 seconds.

The above-described E-beam deposition process, when applied to the deposition of a three-dimensional needle-like structure, has the unique characteristic of enabling monolayer film thickness control, high resolution, and the production of a high aspect ratio structure (i.e., more than 31). For most applications, it will probably be advantageous to produce an elongated magnetic tip shape, which would guarantee that the tip be magnetized along its long axis. Given the nanometer scale tip dimension, a single domain probe tip is achieved, enabling imaging of magnetic structures in the sample surface with atomic level resolution.

It should be understood that the foregoing description is only illustrative of the invention. Various alternatives and modifications can be devised by those skilled in the art without departing from the invention. For instance, while it is preferred that an organometallic be used to create the structures, an organic gas can be employed to grow a carbonized, non-metal structure, which is then seeded via deposition of a seed layer, followed by a magnetic metal deposition from a metallocene vapor. Accordingly, the present invention is intended to embrace all such alternatives, modifications and variances which fall within the scope of the appended claims.

We claim:

1. A probe for a scanned-probe microscope, comprising:
    a substrate;
    a nanometer scale, needle-shaped structure, exhibiting a high aspect ratio, extending from said substrate, said structure comprising a carbonized matrix of a decomposed organic reactant, said structure further exhibiting a substantial stiffness.

2. The probe as recited in claim wherein said carbonized matrix includes metallic deposits interspersed therein.

3. The probe as recited in claim 2 wherein said metallic deposits exhibit maqnetic properties.

4. The probe as recited in claim 3 wherein said structure exhibits a tip diameter sufficiently small that it manifests a single magnetic domain thereat.

5. The probe as recited in claim 1, wherein said needle-shaped structure includes a plurality of protrusions.

6. The probe as recited in claim 5 wherein each said protrusion includes a magnetic layer.

7. The probe as recited in claim 5 wherein some of said plurality of protrusions extend away from said needle-shaped structure.

8. The probe as recited in claim wherein said needle-shaped structure is provided with an expanded tip, said expanded tip exhibiting a three dimensional shape.

9. The probe as recited in claim 8 wherein said expanded tip includes magnetic portions.

10. The probe as recited in claim 1 wherein said substrate comprises a flexible beam having an integral protrusion extending in a perpendicular direction therefrom, said protrusion having an apex surface from which said needle-like structure extends.

11. The invention as recited in claim 10 wherein said flexible beam and protrusion are comprised of a silicon-based material.

12. The probe as recited in claim 1 further comprising:
a thin metal layer disposed on at least a distal end of said structure, said thin metal layer exhibiting magnetic properties.

13. The probe as recited in claim 12 further comprising:
a thin metal-containing interlayer disposed between said distal end of said structure and said thin metal magnetic layer.

14. A structure comprising:
a substrate;
a needle-shaped structure having a tip, said needle-shaped structure extending from said substrate, said needle-shaped structure having a single magnetic domain at said tip.

15. The structure as recited in claim 14 wherein said needle-shaped structure includes a plurality of said tips, some said tips extending away from said structure, each tip exhibiting a single magnetic domain.

16. The structure of claim 14, wherein said needle-shaped structure has an aspect ratio of greater than about 10 to 1.

17. The structure of claim 14, wherein said needle-shaped structure comprises a carbonized matrix of a decomposed organic reactant, said needle-shaped structure exhibiting substantial stiffness.

18. The structure of claim 14, wherein said structure is a probe tip for a scanned-probe microscope.

19. A structure comprising:
a substrate; and
a nanometer scale, needle-shaped organic-based structure, extending from said substrate and exhibiting a high aspect ratio, said needle-shaped structure exhibiting substantial stiffness and a three dimensional tip structure.

20. The structure as recited in claim 19 wherein said three dimensional tip structure comprises a plurality of extensions, at least some said extensions being disposed in a direction that is substantially perpendicular to said needle-shaped structure.

21. The structure as recited in claim 19 wherein certain said extensions comprise different material compositions than other said extensions.

22. The structure as recited in claim 19 wherein said needle shaped structure exhibits electrical conductivity.

23. The structure as recited in claim 22 wherein said three dimensional structure comprises at least one closed loop.

24. The structure as recited in claim 22 wherein said three dimensional structure includes a plurality of loops having different angular orientations with respect to each other.

25. The structure as recited in claim 22 further comprising:
an additional nanometer scale, needle-shaped, organic-based structure extending from said substrate, said three dimensional structure connected between said needle-shaped structures.

26. The structure as recited in claim 25 wherein said three dimensional structure is an open loop having ends connected to said needle shaped structures.

27. The structure as recited in claim 25 wherein said open loop is helical in shape.

* * * * *

UNITED STATES PATENT AND TRADEMARK OFFICE
CERTIFICATE OF CORRECTION

PATENT NO. : 5,171,992

DATED : December 15, 1992

INVENTOR(S) : J. Clabes, M. Hatzakis, K. Lee, B. Petek, J. Slonczewski

It is certified that error appears in the above-identified patent and that said Letters Patent is hereby corrected as shown below:

In the Claims:

Claim 2, col. 10, line 64, after "claim" insert --1--.

Claim 8, col. 11, line 11, after "claim" insert --1--.

Signed and Sealed this

Twelfth Day of October, 1993

Attest:

BRUCE LEHMAN

Attesting Officer      Commissioner of Patents and Trademarks